United States Patent [19]
Chen et al.

[11] Patent Number: 6,093,634
[45] Date of Patent: Jul. 25, 2000

[54] METHOD OF FORMING A DIELECTRIC LAYER ON A SEMICONDUCTOR WAFER

[75] Inventors: Ing-Tang Chen, Taipei; Horng-Bor Lu, Hsin-Chu, both of Taiwan

[73] Assignee: United Microelectronics Corp., Hsin-chu, Taiwan

[21] Appl. No.: 09/360,618

[22] Filed: Jul. 26, 1999

[51] Int. Cl.$^7$ .............................................. H01L 21/4763
[52] U.S. Cl. ...................... 438/622; 438/453; 438/597; 438/618
[58] Field of Search .................... 438/622, 618, 438/597, 584, 453

[56] References Cited

U.S. PATENT DOCUMENTS 5,089,442  2/1992  Olmer ..................................... 432/235
5,946,592  3/1998  Lin ......................................... 438/633

*Primary Examiner*—Matthew Smith
*Assistant Examiner*—Granvill Lee
*Attorney, Agent, or Firm*—Winston Hsu

[57] ABSTRACT

The present invention provides a method of forming a dielectric layer on a semiconductor wafer. The semiconductor wafer comprises a bottom dielectric layer and a plurality of metal lines each having a rectangular cross section positioned on the bottom dielectric layer. The method is performed in a high-density plasma chemical vapor deposition apparatus. A first deposition process at a first etching/deposition (E/D) ratio is performed to form a first dielectric layer with a predetermined thickness on the semiconductor wafer. The first dielectric layer covers the surface of the metal lines and forms a triangular ridge above each metal line. The upper side of each of the ridges has two slanted side-walls. Then, a second deposition process at a second E/D ratio is performed to form a second dielectric layer with a predetermined thickness on the semiconductor wafer with the second deposition process etching rate being near zero. The second dielectric layer above each metal line reduces the slope of the two slanted side-walls of the ridges. Thus, a dielectric layer with the first dielectric layer and the second layer is formed.

8 Claims, 4 Drawing Sheets

METHOD OF FORMING A DIELECTRIC LAYER ON A SEMICONDUCTOR WAFER

BACKGROUND OF THE INVENTION

1. Field of the Invention

The present invention provides a method of forming a dielectric layer on a semiconductor wafer, and more particularly, of forming a dielectric layer over a plurality of metal lines on a semiconductor wafer.

2. Description of the Prior Art

Metal lines on a semiconductor wafer are usually used for interconnecting electric devices. In order to prevent short circuiting of the metal lines, a dielectric layer of silicon oxide is usually formed to completely fill the gaps between the metal lines. The minimum line width and line space become smaller and smaller as IC technology progresses. Thus, the dielectric layer is usually formed by high-density plasma vapor deposition (HDPCVD) to ensure complete filling of the gaps. However, the surface topology of the dielectric layer formed by HDPCVD is usually quite poor as to cause the formation of voids within the subsequently deposited cap dielectric layer. These voids damage the yield rate and the reliability of IC product.

Please refer to FIG. 1, FIG. 1 is a cross sectional diagram of a semiconductor wafer with a dielectric layer formed on metal lines according to the prior art. A semiconductor wafer 10 comprises a bottom dielectric layer 12 made of silicon oxide and a plurality of metal lines 14 each having a rectangular cross section positioned on the bottom dielectric layer 12. According to the prior art, a dielectric layer 16 on the semiconductor wafer 10 is formed in a HDPCVD apparatus (not shown) with a fixed etching to deposition ratio (E/D ratio) to cover the bottom dielectric layer 12 and the metal lines 14. The E/D ratio is defined as the ratio of the etching rate to the deposition rate of the dielectric layer 16 during its formation. A large E/D ratio is used in the prior art to make sure that the dielectric layer 16 can completely fill the gaps between the metal lines. Since the etching rate depends on the ion collision angle on the surface of the semiconductor wafer, each of the portions of the dielectric layer 16 above the metal lines 16 has a triangular ridge with two slanted side-walls 17.

Please refer to FIG. 2, FIG. 2 is a cross sectional diagram of a semiconductor wafer with a cap dielectric layer formed on the dielectric layer in FIG. 1. Plasma-enhanced chemical vapor deposition (PECVD) is the method used for forming a cap dielectric layer 18 on the semiconductor wafer 10 according to prior art. A silicon oxide layer formed by PECVD with silane (SiN4) as a reactant gas is known as a PEOX layer. It is used to form the cap dielectric layer 18 and protect the electric devices and the metal lines 14.

It is a well-known fact that the PEOX layer has poor conformality and therefore voids may easily form. If the slant of the side-walls 17 is too steep, the recesses formed by the triangular ridges become deeper. Even though the PEOX layer is formed on the semiconductor wafer 10, it cannot completely fill the recesses and voids 19 are generated. Also, there is great stress between the cap dielectric layer 18 and the dielectric layer 16 because the sharper-angles of the triangular ridges is enhanced by the greater tilt angles of the slant side-walls 17. This results in a higher probability of peeling and cracking during subsequent CMP processing. Moreover, it is possible that the slurry used in the subsequent CMP process will remain in the voids 19 of the cap dielectric layer 18. The slurry residue not only reduces the yield and the reliability of the IC product, but also contaminates the whole production line in IC manufacturing.

Tetra-ethyl-ortho-silicate gas can take the place of SiH4 gas for forming a silicon oxide layer by a PECVD apparatus known as the PETEOS layer. The PETEOS layer has been proven to have better conformality leading to a lower rate of void formation inside the cap dielectric layer 18. However, the cost of forming a PETEOS layer is prohibitively high thus causing the IC product to lose its competitive edge in the marketplace. Thus, the most reasonable way for preventing the formation of voids in the cap dielectric layer 18 is to improve the topology of the dielectric layer 16, so the yield of the IC product can be increased.

SUMMARY OF THE INVENTION

It is therefor a primary objective of the present invention to provide a method of forming a dielectric layer on the metal lines of a semiconductor wafer to prevent the formation of voids in the subsequent cap dielectric layer and increase the yield rate of the IC products.

In a preferred embodiment, the present invention provides a method of forming a dielectric layer on a semiconductor wafer, the semiconductor wafer comprising a bottom dielectric layer and a plurality of metal lines each having a rectangular cross section positioned on the bottom dielectric layer, the method being performed in a high density plasma chemical vapor deposition (HDPCVD) apparatus which can simultaneously deposit a dielectric material on the semiconductor wafer and etch the dielectric material deposited on the semiconductor wafer, the method comprising the following steps:

performing a first deposition process at a first etching/deposition (E/D) ratio to form a first dielectric layer with a predetermined thickness on the semiconductor wafer, the first dielectric layer covering the surface of the metal lines and forming a triangle ridge above each metal line, the upper side of each of the ridges having two slanted side-walls; and performing a second deposition process at a second E/D ratio to form a second dielectric layer with a predetermined thickness on the semiconductor wafer over which the etching rate of the second deposition process is near zero and the second dielectric layer above each metal line reduces the slope of the two slanted side-walls of the ridges.

It is an advantage of the present invention that the method for forming the dielectric layer according to the present invention can produce more gradually slanted side-walls to prevent void formation in the subsequent cap dielectric layer. Moreover, the present invention also reduces the stress between the formed dielectric layer and the following cap dielectric layer.

This and other objectives of the present invention will no doubt become obvious to those of ordinary skill in the art after having read the following detailed description of the preferred embodiment which is illustrated in the various figures and drawings.

DETAILED DESCRIPTION OF THE PREFERRED EMBODIMENT

Figure 1:
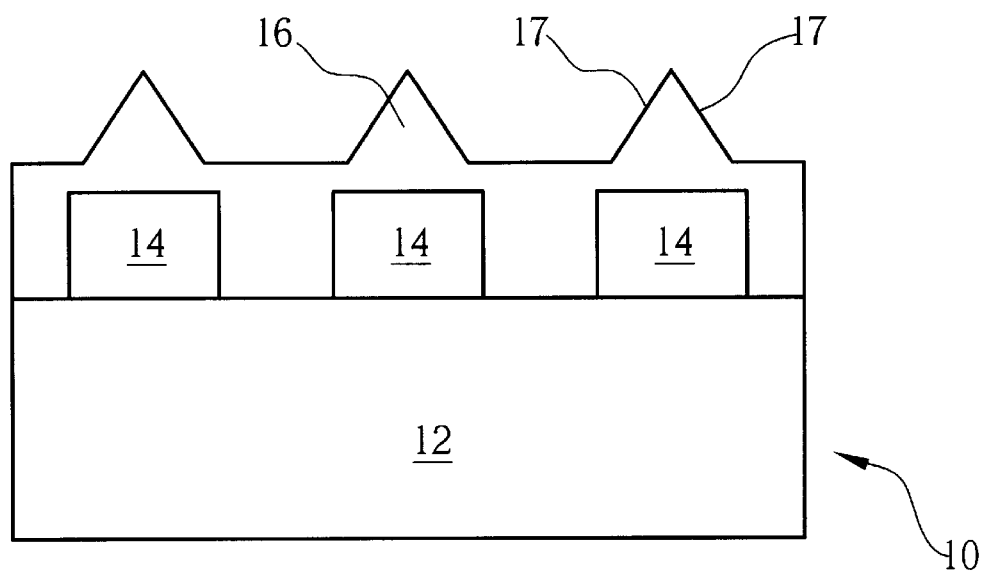
FIG. 1 is a cross-sectional diagram illustrating the formation of a dielectric layer on metal lines according to the prior art.
Figure 2:
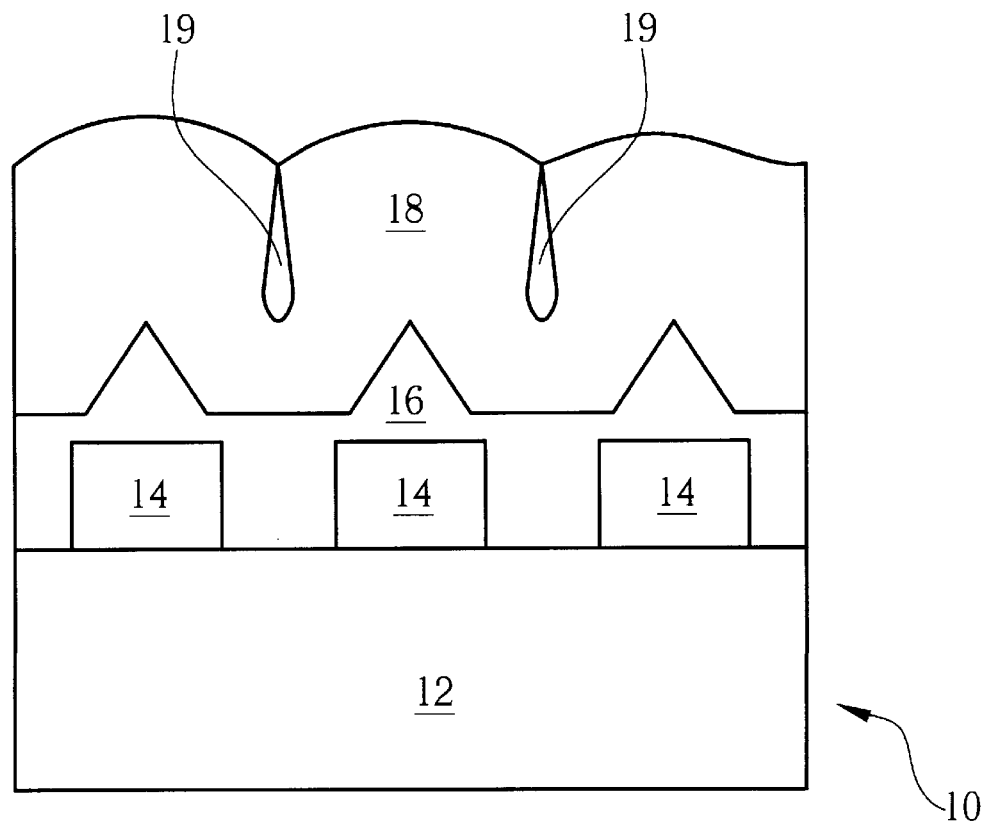
FIG. 2 is a cross-sectional diagram illustrating the formation of a cap dielectric layer on the dielectric layer in FIG. 1.
Figure 3:
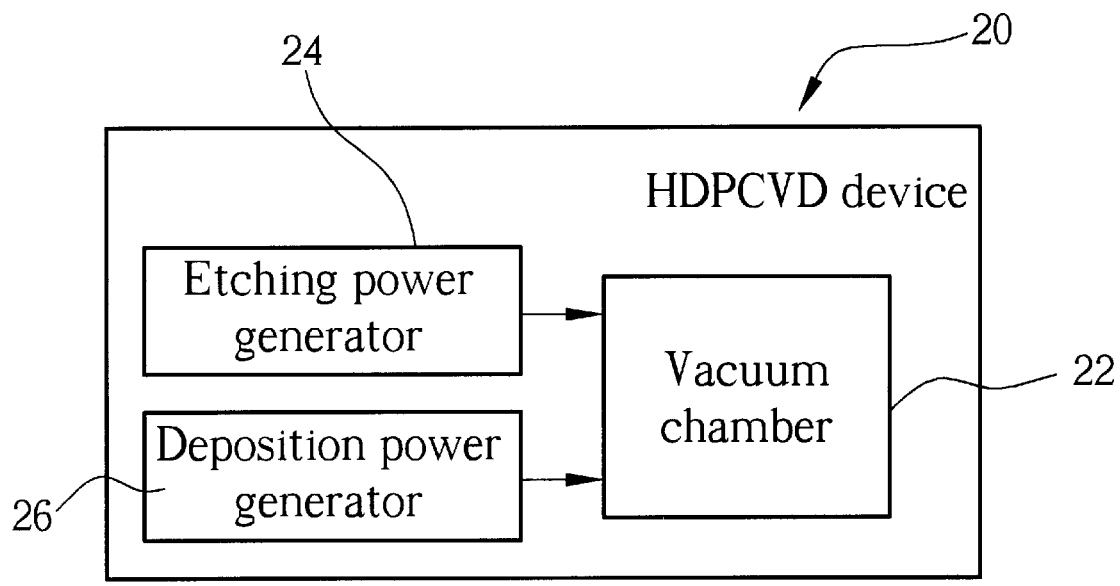
FIG. 3 is a functional block-diagram of a HDPCVD apparatus for the formation of the dielectric layer according to the present invention.
Figure 4:
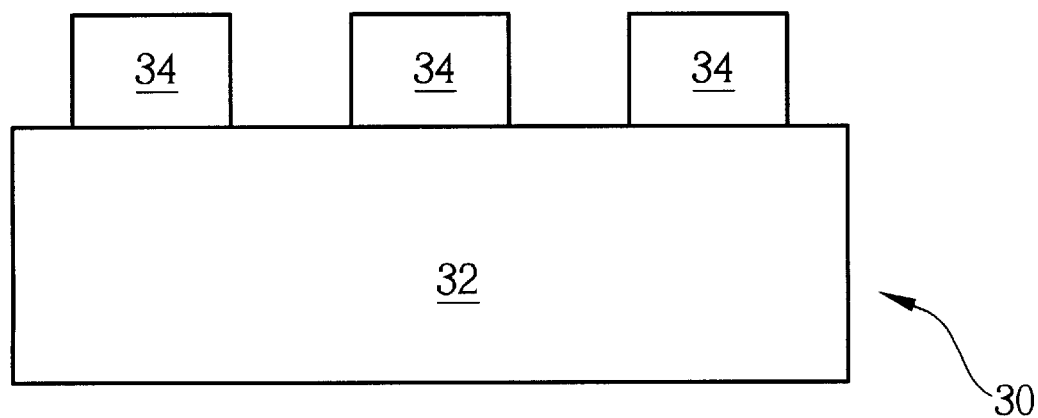
FIG. 4 to FIG. 6 are cross-sectional diagrams illustrating the formation of a dielectric layer on metal lines according to the present invention.
Figure 5:
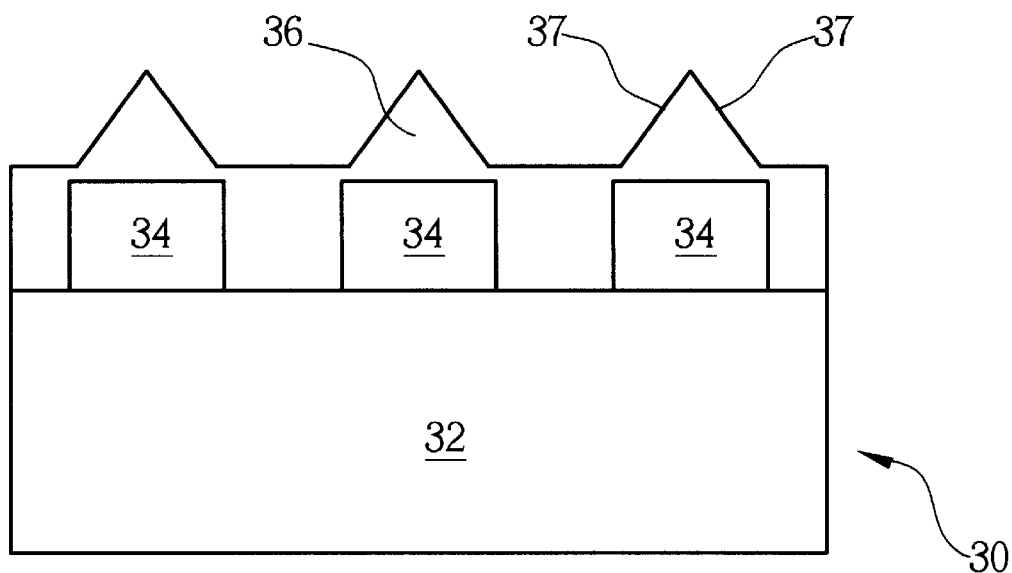
Figure 6:
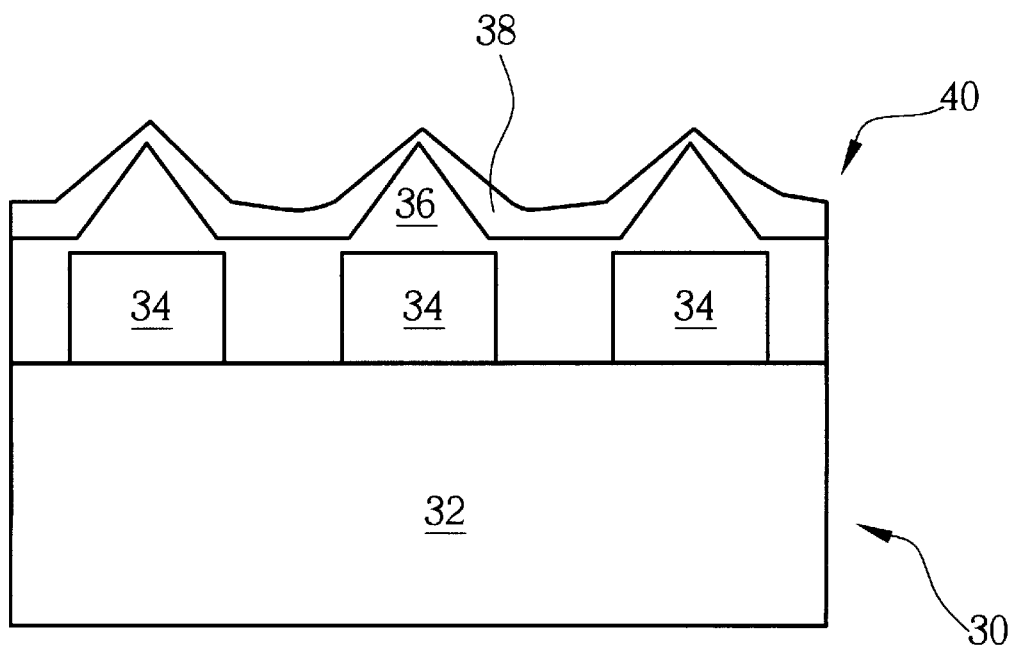

Please refer to FIG. 3 to FIG. 6, FIG. 3 is a functional block-diagram of a HDPCVD apparatus for the formation of the dielectric layer according to the present invention. FIG. 4 to FIG. 6 are cross-sectional diagrams illustrating the formation of a dielectric layer on metal lines according to the present invention. The method of forming a dielectric layer 40 on a semiconductor wafer 30 according to the present invention is performed in a high-density plasma chemical vapor deposition (HDPCVD) apparatus 20. The HDPCVD apparatus 20 simultaneously deposits and etches dielectric material on the semiconductor wafer 30. As shown in FIG. 3, the HDPCVD apparatus 20 comprises a vacuum chamber 22 for performing the HDPCVD process, an etching power generator 24 that provides energy for sustaining an etching rate for etching the dielectric material, and a deposition power generator 26 that provides energy for sustaining a deposition rate for depositing the dielectric material on the semiconductor wafer 30. The HDPCVD apparatus 20 deposits the dielectric material on the semiconductor wafer 30 at a deposition rate "A" when the etch rate is zero and etches the dielectric material deposited on the semiconductor wafer 30 at an etching rate "B" when the deposition rate is zero. The etching to deposition (E/D) ratio during a HDPCVD process is defined as B/(A-B).

As shown in FIG. 4, the semiconductor wafer 30 undergoing HDPCVD processing comprises a bottom dielectric layer 32 and a plurality of metal lines 34 each having a rectangular cross section positioned on the bottom dielectric layer 32. The metal lines 34 are made of Al or Cu alloy. To form a dielectric layer 40 on the semiconductor wafer 30 according to the method of the present invention, the semiconductor wafer 30 is loaded inside the vacuum chamber 22 of the HDPCVD apparatus 20. $SiH_4$, $O_2$ and Ar gas are introduced in the vacuum chamber 22 and react to form dielectric material of silicon oxide.

The first step of operating the HDPCVD apparatus 20 according to the present invention is to turn on the etching power generator 24 and the deposition power generator 26 to perform a first deposition process at a first E/D ratio greater than 1.1. The first deposition process forms a first dielectric layer 36 with a predetermined thickness on the semiconductor wafer 30. The first dielectric layer 36 has a thickness that is approximately equal to that of the metal lines 34 and completely fills the gaps between the metal lines 34. Since the etching rate depends on the ion collision angle on the surface of the semiconductor wafer 30, each of the portions of the first dielectric layer 36 above the metal lines 34 has a triangular ridge with two slanted side-walls 37 as shown in FIG. 5.

After the formation of the first dielectric layer 36, a second deposition process at a second E/D ratio is performed to form a second dielectric layer 38 with a predetermined thickness on the semiconductor wafer 30 with the etching power generator turned off. Since the etching rate of the second deposition process is near zero, the thickness of the second dielectric layer 38 is thicker at the bottom part of the slanted side-walls 37 than at the top part of the slanted side-walls 37. Therefore, the second dielectric layer 38 deposited on the semiconductor wafer 30 can reduce the gradient of the two slanted side-walls 37 on each of the metal lines. The layer composed of the first dielectric layer 36 and the second dielectric layer 38 together constitute the dielectric layer 40 formed on the metal lines 34 according to the present invention.

Figure 7:
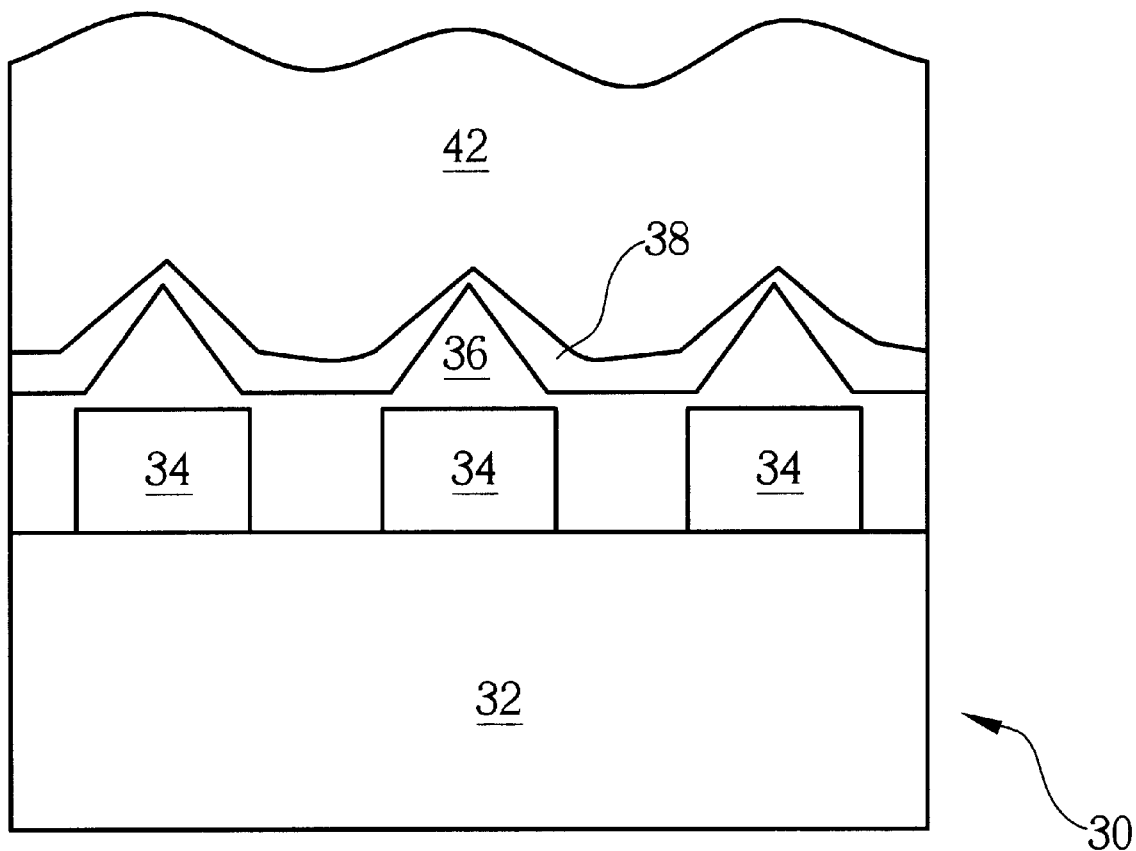
FIG. 7 is a cross-sectional diagram illustrating the formation of a cap dielectric layer on the dielectric layer in FIG. 6.

Please refer to FIG. 7, FIG. 7 is a cross-sectional diagram illustrating the formation of a cap dielectric layer on the dielectric layer in FIG. 6. Formation of a cap dielectric layer on the dielectric layer 40 is performed after the formation of the dielectric layer 40. The gentler slanting side-walls 37 form shallow recesses that each have wide openings. Thus, even a low-cost PEOX layer with poor conformity can be used as a cap dielectric layer 42 in which no voids will form. Both high yield and low cost are guaranteed. Also, stress between the cap dielectric layer 42 and the second dielectric layer 38 diminishes as the tilt angle of the slanted side-walls is reduced. Therefore, no cracking or peeling will occur during the following CMP process.

According to the present invention, two deposition processes are performed inside the same vacuum chamber 22 of the HDPCVD apparatus 20. The first deposition process is performed to completely fill the gaps between the metal lines 34 with a dielectric material. The second deposition process with a near zero etching rate is performed to reduce the tilt angle of the slanted side-walls and to avoid generating voids in the subsequent cap dielectric layer 42. By comparison with the time needed for forming a dielectric layer at a fixed E/D ratio according to the prior art, the time needed for forming a dielectric layer with the same thickness according to the present invention is more economical since there is a period of time with a near zero etching rate. Thus, the processing time can be reduced. Moreover, a process with minimal plasma damage is achieved since the etching power generator 24 is turned off during the second deposition process and ions inside the chamber 22 therefore do not gain energy to bombard the semiconductor wafer 30.

In contrast to the method of forming a dielectric layer according to the prior art, in the method according to the present invention, a first deposition process with a predetermined E/D ratio is first performed to form the first dielectric layer 36 with a predetermined thickness. Then, a second deposition process with a near zero etching rate is performed to form the second dielectric layer 38 with a predetermined thickness. Thus, a dielectric layer 40 is formed as the combination of the first and the second dielectric layer 36, 38. Because of the gentler slanted side-walls 37 on each of the metal lines 34, no voids will be formed during the formation of the cap dielectric layer 42 to degrade the yield of the IC products.

Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A method of forming a dielectric layer on a semiconductor wafer, the semiconductor wafer comprising a bottom dielectric layer and a plurality of metal lines each having a rectangular cross section positioned on the bottom dielectric layer, the method being performed in a high density plasma chemical vapor deposition (HDPCVD) apparatus which can simultaneously deposit a dielectric material on the semiconductor wafer and etch the dielectric material deposited on the semiconductor wafer, the method comprising the following steps:

performing a first deposition process at a first etching/deposition (E/D) ratio to form a first dielectric layer with a predetermined thickness on the semiconductor wafer, the first dielectric layer covering the surface of the metal lines and forming a triangle ridge above each metal line, the upper side of each of the ridges having two slanted side-walls;

performing a second deposition process at a second E/D ratio to form a second dielectric layer with a predetermined thickness on the semiconductor wafer over which the etching rate of the second deposition process is near zero and the second dielectric layer above each metal line reduces the slope of the two slanted sidewalls of the ridges;

performing a plasma enhanced chemical vapor deposition (PECVD) method to form a cap dielectric layer on the second dielectric layer; and performing a chemical mechanical polishing (CMP) process on the cap dielectric layer.

2. The method in claim 1 wherein the HDPCVD apparatus deposits the dielectric material on the semiconductor wafer at a deposition rate A when the etching rate is zero and etches the dielectric material deposited on the semiconductor wafer at an etching rate B when the deposition rate is zero, and the E/D ratio of the HDPCVD apparatus is defined as B/(A-B), and wherein when performing the first deposition process, the first E/D ratio of the HDPCVD apparatus is greater than 1.1.

3. The method of claim 1 wherein the HDPCVD apparatus comprises a vacuum chamber and the first and second deposition processes are both performed in the vacuum chamber.

4. The method of claim 1 wherein the HDPCVD apparatus comprises an etching power generator that provides energy for sustaining an etching rate for etching the dielectric material deposited on the semiconductor wafer and a deposition power generator that provides energy for sustaining a deposition rate for depositing the dielectric material on the semiconductor wafer.

5. The method of claim 1 wherein the dielectric material is silicon oxide.

6. The method of claim 1 wherein the dielectric material is formed by a plasma reaction process performed in the HDPCVD apparatus which uses $SiH_4$, $O_2$ and Ar as reactants.

7. The method of claim 1 wherein the thickness of the first dielectric layer formed by the first deposition process is approximately the same as that of the metal lines.

8. The method of claim 1 wherein the metal lines are made of Al or Cu alloy.

* * * * *